United States Patent
Su et al.

(10) Patent No.: US 8,755,015 B2
(45) Date of Patent: Jun. 17, 2014

(54) DISPLAY DEVICE HAVING UNEVEN OPTICAL ENHANCE LAYER AND ELECTRICAL APPARATUS

(75) Inventors: Po-Kun Su, Chu-Nan (TW); Ryuji Nishikawa, Chu-Nan (TW)

(73) Assignee: Innolux Corporation, Chu-Nan (TW)

( * ) Notice: Subject to any disclaimer, the term of this patent is extended or adjusted under 35 U.S.C. 154(b) by 1209 days.

(21) Appl. No.: 12/633,665

(22) Filed: Dec. 8, 2009

(65) Prior Publication Data

US 2010/0157453 A1 Jun. 24, 2010

Related U.S. Application Data

(60) Provisional application No. 61/121,105, filed on Dec. 9, 2008.

(30) Foreign Application Priority Data

Aug. 20, 2009 (TW) .............................. 98128107 A

(51) Int. Cl.
| | | |
|---|---|---|
| G02F 1/1335 | (2006.01) | |
| G02F 1/1337 | (2006.01) | |
| H01L 51/52 | (2006.01) | |
| G02B 3/00 | (2006.01) | |
| G02B 5/08 | (2006.01) | |
| G02B 5/00 | (2006.01) | |
| G02B 5/02 | (2006.01) | |
| G02B 5/20 | (2006.01) | |

(52) U.S. Cl.
CPC ............ *G02B 5/003* (2013.01); *H01L 51/5271* (2013.01); *H01L 51/5281* (2013.01); *H01L 51/5262* (2013.01); *G02B 3/0056* (2013.01); *G02B 5/0858* (2013.01); *G02B 5/0263* (2013.01); *G02B 5/201* (2013.01)
USPC ............................ 349/129; 349/113; 349/114

(58) Field of Classification Search
CPC ................... G02F 1/133555; G02F 1/133553; G02F 1/1335; G02F 1/1337; G02F 1/133504
USPC ........................................ 349/113, 114, 129
See application file for complete search history.

(56) References Cited

U.S. PATENT DOCUMENTS

| | | | |
|---|---|---|---|
| 7,277,143 B2 * | 10/2007 | Funahata et al. ............... | 349/114 |
| 2005/0122449 A1 * | 6/2005 | Liu ............................... | 349/113 |
| 2006/0114379 A1 * | 6/2006 | Nagayama et al. ........... | 349/113 |
| 2008/0111932 A1 * | 5/2008 | Yamaguchi et al. ............ | 349/38 |
| 2008/0170189 A1 * | 7/2008 | Naka et al. ..................... | 349/113 |
| 2009/0032942 A1 * | 2/2009 | Choi ............................. | 257/737 |

FOREIGN PATENT DOCUMENTS

| | | |
|---|---|---|
| CN | 1510462 | 7/2004 |
| CN | 101013745 | 8/2007 |
| JP | 2002-341342 | 11/2002 |

\* cited by examiner

*Primary Examiner* — Huyen Ngo

(74) *Attorney, Agent, or Firm* — Liu & Liu

(57) ABSTRACT

A display device and an electrical apparatus are disclosed. The display device comprises a first substrate, an optical enhance layer, a display layer, a first electrode and a second electrode. The first substrate includes a plurality of pixel areas. The optical enhance layer is formed on the first substrate and includes a plurality of even structures and a plurality of uneven structures, wherein for each pixel area, one of the even structures corresponds to a portion of the pixel area, and one of the uneven structures corresponds to the rest portion of the pixel area. The first electrode is formed on the optical enhance layer. The display layer is formed on the first electrode. The second electrode is formed on the display layer. The display device is applicable to the electrical apparatus.

16 Claims, 5 Drawing Sheets

DISPLAY DEVICE HAVING UNEVEN OPTICAL ENHANCE LAYER AND ELECTRICAL APPARATUS

CROSS REFERENCE TO RELATED APPLICATION

The present application claims the benefit of the filing date under 35 U.S.C. §119(e) of a Provisional U.S. Patent Application No. 61/121,105, entitled "OLED with partially optical enhance structure", filed on Dec. 9, 2008, which is incorporated by reference herein.

FIELD OF THE INVENTION

The present invention relates to a display device and an electrical apparatus, and more particularly, to a display device and an electrical apparatus including a plurality of partial uneven structures.

BACKGROUND OF THE INVENTION

Currently, with technological advantages, many types of display apparatus have been widely applied in flat panel displays (FPDs), such as liquid crystal displays (LCDs) or electro luminescence (EL) displays.

Please refer to FIG. 1, which is a partially cross-sectional view showing a conventional display apparatus. Taking an EL display 900 for example, the EL display 900 includes a substrate 901, an insulating layer 902, an anode 903, a hole transportation layer 904, an emissive layer 905, an electron transportation layer 906 and a cathode 907. The insulating layer 902, the anode 903, the hole transportation layer 904, the emissive layer 905, the electron transportation layer 906 and the cathode 907 are stacked on the substrate 901 in sequence. The whole surface of the insulating layer 902 is formed as an uneven structure, and thus the layers 903-907 stacked thereon can also have uneven structures. Therefore, the EL display 900 can use the uneven structure to raise the surface area of the emissive layer 905, thereby raising the emitting brightness of the EL display 900.

However, the uneven structure of the above-mentioned display 900 may affect the display contrast thereof, resulting in reduced display quality.

SUMMARY OF THE INVENTION

Therefore, an aspect of the present invention is to provide a display device and an electrical apparatus, thereby forming a plurality of even structures and a plurality of uneven structures on an optical enhance layer to enhance the contrast thereof.

According to an embodiment of the present invention, the display device comprises a first substrate, an optical enhance layer, a display layer, a first electrode and a second electrode. The first substrate includes a plurality of pixel areas. The optical enhance layer is formed on the first substrate and includes a plurality of even structures and a plurality of uneven structures, wherein for each pixel area, one of the even structures corresponds to a portion of the pixel area, and one of the uneven structures corresponds to the rest portion of the pixel area. The first electrode is formed on the optical enhance layer. The display layer is formed on the first electrode. The second electrode is formed on the display layer.

According to another embodiment of the present invention, the above-mentioned display device is applicable to an electrical apparatus.

Therefore, with the use of the display device and the electrical apparatus disclosed in the embodiments of the present invention, the optical effect and the contrast of the display device can be enhanced, thereby enhancing the display quality.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
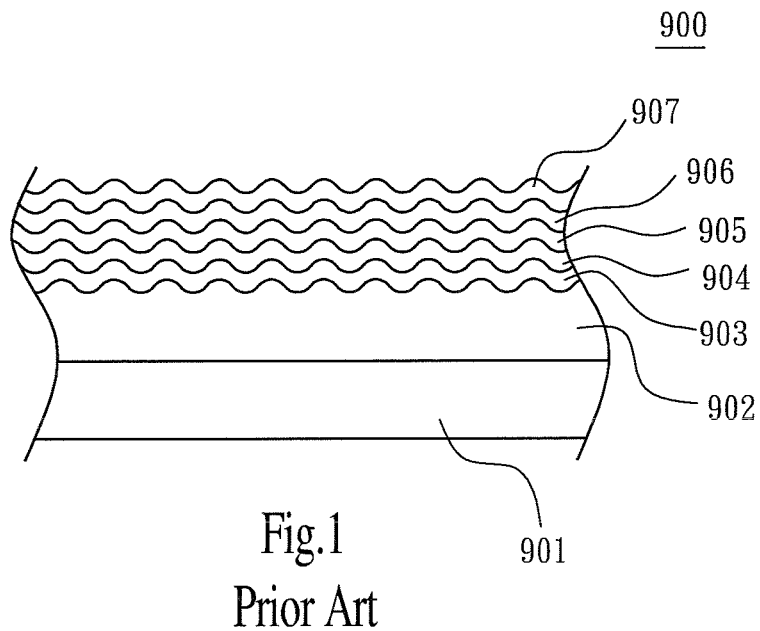
FIG. 1 is a partially cross-sectional view showing a conventional display apparatus.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom," as well as derivative thereof (e.g., "horizontally," "downwardly," "upwardly," etc.), should be construed to refer to the orientation as then described or as shown in the drawings under discussion. These relative terms are for convenience of description and do not require that the apparatus be constructed or operated in a particular orientation. In the drawings, like reference numerals correspondingly indicate like components or items.

Figure 2:
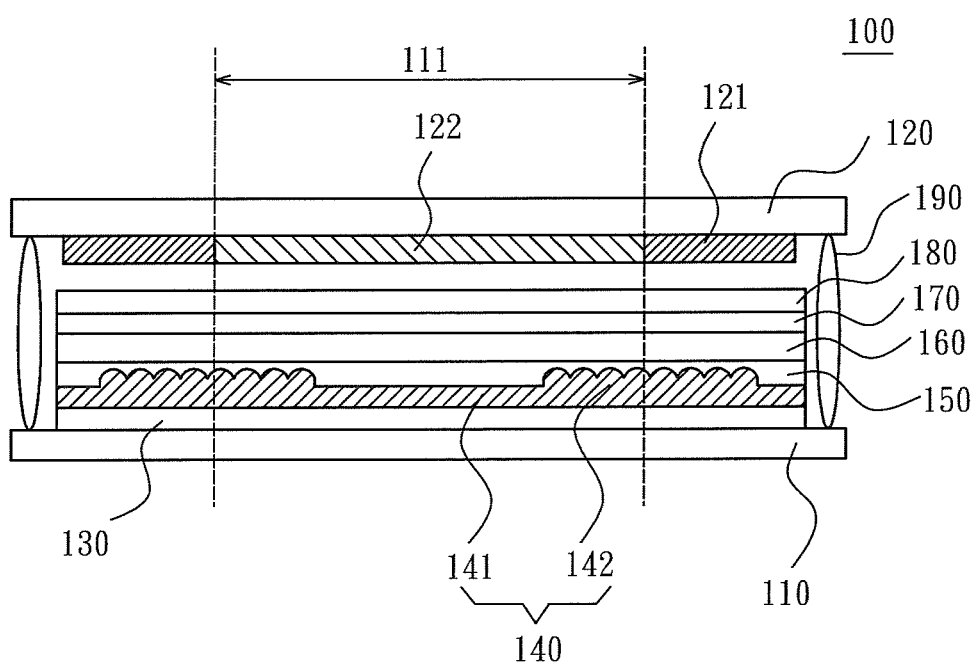
FIG. 2 is a partially cross-sectional view showing a display device according to a first embodiment of the present invention.

Please referring to FIG. 2, which is a partially cross-sectional view showing a display device according to a first embodiment of the present invention. The display device 100 of the present embodiment may be a self-emission type display device, such as an organic light-emitting diode (OLED) display, comprising a first substrate 110, a second substrate 120, a reflective layer 130, an optical enhance layer 140, a planar layer 150, a first electrode 160, a display layer 170 and a second electrode 180. The reflective layer 130, the optical enhance layer 140, the planar layer 150, the first electrode 160, the display layer 170 and the second electrode 180 are stacked on the first substrate 110 in sequence and disposed between the first substrate 110 and second substrate 120.

Referring to FIG. 2 again, the first substrate 110 of the present embodiment may be a glass substrate, a flexible plastic substrate, a wafer substrate or a heat dissipation substrate. The first substrate 110 may include a plurality of pixel areas 111, a plurality of signal lines (not shown) and switch devices (not shown). The signal lines are configured to transmit signals, such as scanning signals, data signals or testing signals. The signal lines are arranged crisscrossed, and comprise a plurality of data lines arranged vertically and a plurality of scanning lines arranged in parallel to form the pixel areas 111 arranged in a matrix manner. Each of the switch devices may be a thin film transistor (TFT) disposed in each of the pixel areas 111 and electrically connected to the adjacent signal lines. The first electrode 160 is formed on the optical enhance layer 140 and electrically connected to the switch devices. Therefore, the first electrode 160 may be a pixel electrode controlled by the switch devices.

It notes that a single pixel area 111 is shown in FIG. 2 for simplifying this description, and the following description is explained in further detail according to the single pixel area 111.

Referring to FIG. 2 again, the second substrate 120 of the present embodiment may be a glass substrate or a flexible plastic substrate for packaging and protecting the display device 100. The second substrate 120 may include a plurality of black matrix layers 121 and a plurality of color filter layers 122. The material of the black matrix layers 121 may be metal (such as chromium), graphite or polymeric material formed on the second substrate 120 to have a black matrix structure for separating the color filter layers 122. The color filter layers 122 are made of color resist material with different colors and pervious to light for colorization. At this time, the display layer 170 may provide a white light for passing the color filter layers 122, thereby forming color lights. In one embodiment, the display layer 170 may directly provide the color lights without passing color filter layers 122, and thus the color filter layers 122 of the second substrate 120 can be omitted.

The display device 100 may further comprises spacers 190 which are disposed between the first substrate 110 and the second substrate 120 for adjusting the gap there between. The spacers 190 may be made of silica, polymer or resistant material, and in the form of a spherical shape or a column shape.

The reflective layer 130 of the present embodiment may be made of a light reflective material for reflecting light towards the second substrate 120. The light reflective materials may be Au, Ag, Al, Au, Cr, Cu, In, Ir, Ni, Pt, Re, Rh, Sn, Ta, W, Mn, white paint (such as Titanium dioxide) with etiolation-resistant and heat-resistant properties or any combination thereof.

The optical enhance layer 140 may be made of an insulating material, such as heat-resistant plastic, glass fiber, polyphthalamide (PPA), boron nitride, aluminum nitride, silicon nitride, silicon oxynitride, silicon dioxide, aluminum oxide, titanium oxide, calcium oxide, silicon, gallium arsenide, ceramic material or any combination thereof, formed between the first substrate 110 and the first electrode 160. In this embodiment, the optical enhance layer 140 may be formed on the reflective layer 130. At this time, the optical enhance layer 140 is pervious to light.

Referring to FIG. 2 again, the optical enhance layer 140 of the present embodiment includes a plurality of even structures 141 and a plurality of uneven structures 142. For each pixel area 111, the even structure 141 corresponds to a portion of the pixel area 111, and the uneven structure 142 corresponds to the rest portion of the same pixel area 111. That is, the optical enhance layer 140 corresponds to the whole area of the pixel areas 111 and includes the even structure 141 and the uneven structure 142 at the same time. For each pixel area 111, the percentage of an area of the rest portion of the pixel corresponding to the uneven structure 142 is in a range from 10% to 90%, such as in the range from 30% to 60%. Each of the uneven structures 142 may comprise a plurality of continuous micro-convexes or micro-concaves with an identical size or different sizes. These micro-convexes or micro-concaves can be made by using a patterning method, such as photolithography or etching method. The size (the height or the width) of each of the micro-convexes or the micro-concaves is substantially 2 μm~5 μm. Each of the micro-convexes or the micro-concaves may be in the form of a hemisphere shape, a cone, a pyramid shape, a rectangular block shape or any appropriate shape.

Figure 3A:
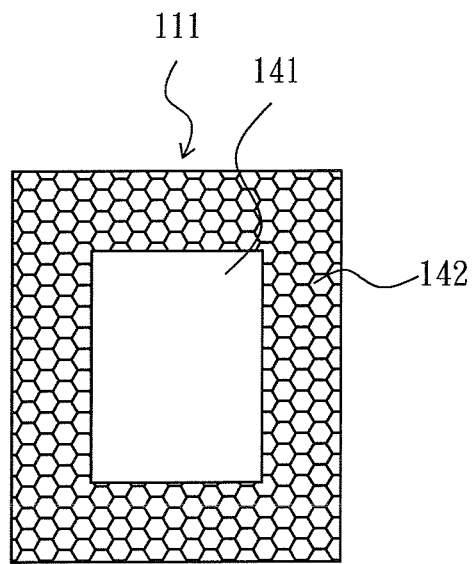
FIG. 3A through FIG. 3D are top views showing an optical enhance layer according to the present invention.
Figure 3B:
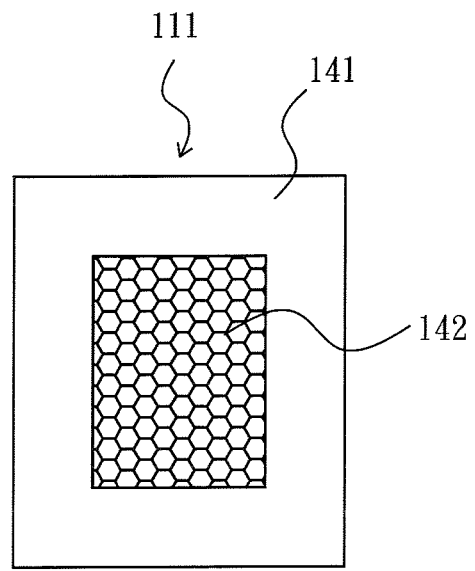
Figure 3C:
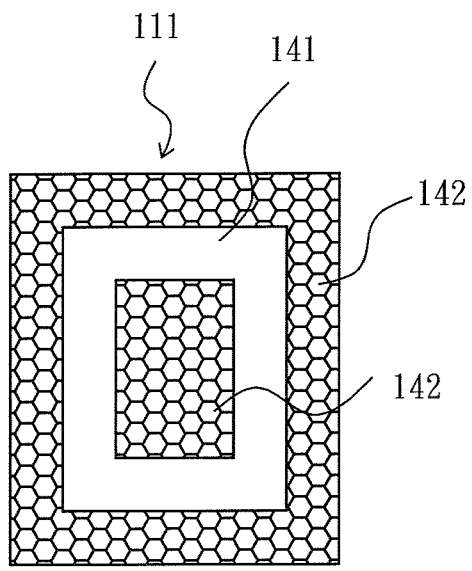
Figure 3D:
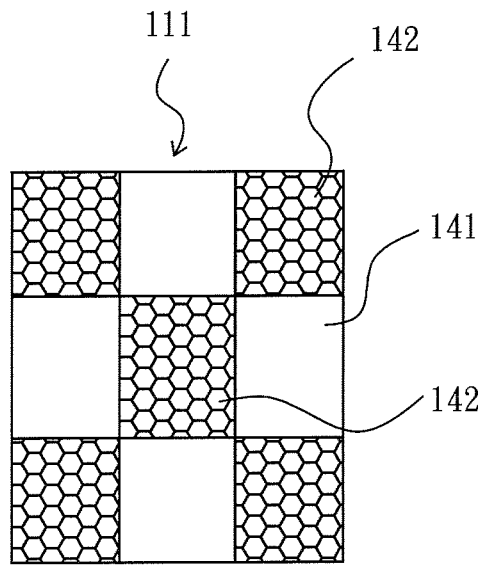

Referring to FIG. 2 through FIG. 3D, FIG. 3A through FIG. 3D are top views showing an optical enhance layer according to the present invention. Referring to FIG. 2 and FIG. 3A again, for each pixel area 111, when the area of the uneven structure 142 corresponds to a portion of the pixel area 111, the area of the uneven structure 142 may correspond to an outer area of the pixel area 111, and the area of the even structure 141 may correspond to an inner area of the pixel area 111. At this time, the area corresponding to the uneven structure 142 may also correspond to the area of the black matrix layer 121. Referring to FIG. 3B again, in another embodiment, for each pixel area 111, the area of the uneven structure 142 may correspond to the inner area of the pixel area 111, and the area of the even structure 141 may correspond to the outer area of the pixel area 111. However, for each pixel area 111, the arrangement of the even structure 141 and the uneven structure 142 may be in any appropriate manner. For example, the even structure 141 and the uneven structure 142 may respectively have multiple regions arranged in an annular interlaced manner as shown in FIG. 3C or a chessboard-like interlaced manner as shown in FIG. 3D. However, the arrangement of the even structure 141 and the uneven structure 142 are not limited to the above examples.

Referring to FIG. 2 again, the planar layer 150 of the present embodiment is formed on the optical enhance layer 140. The planar layer 150 may be made of transparent organic material or transparent oxidization material. The first electrode 160 and the second electrode 180 may be made of transparent and electrically-conductive material, such as ITO, IZO, AZO, GZO, TCO or ZnO. In the present embodiment, the display layer 170 can be an emitting layer of an OLED display, and the first electrode 160 can be formed on the planar layer 150 to be an anode, and the second electrode 180 can formed on the display layer 170 to be a cathode. At this time, the display layer 170 may comprise a hole injection layer, a hole transportation layer, an emission layer, an electron transportation layer and an electron injection layer stacked on the first electrode 160 in sequence. The display layer 170 can be drove to emit light by the current which is provided by the switch device. The light of display layer 170 can be sent out through the transparent second electrode 180 and the transparent second substrate 120.

Therefore, when the display device 100 displays images, the display layer 170 can emit a light, such as a white light, and the light can pass through the color filter layers 122 to form color lights. At this time, the light passing through the first substrate 110 can be improved by the uneven structures 142 of the optical enhance layer 140, and then reflected by the reflective layer 130. The uneven structures 142 of the optical enhance layer 140 can improve the optical effect of the light provided by the display layer 170, thereby diffusing light, raising brightness and broadening the viewing angle of the display device 100. At the same time, for each pixel area 111, the uneven structure 142 is merely formed on the area corresponding to a portion of the pixel area 111 but not the whole area thereof. Therefore, the contrast of the display device 100 can be enhanced for enhancing the display quality.

Figure 4:
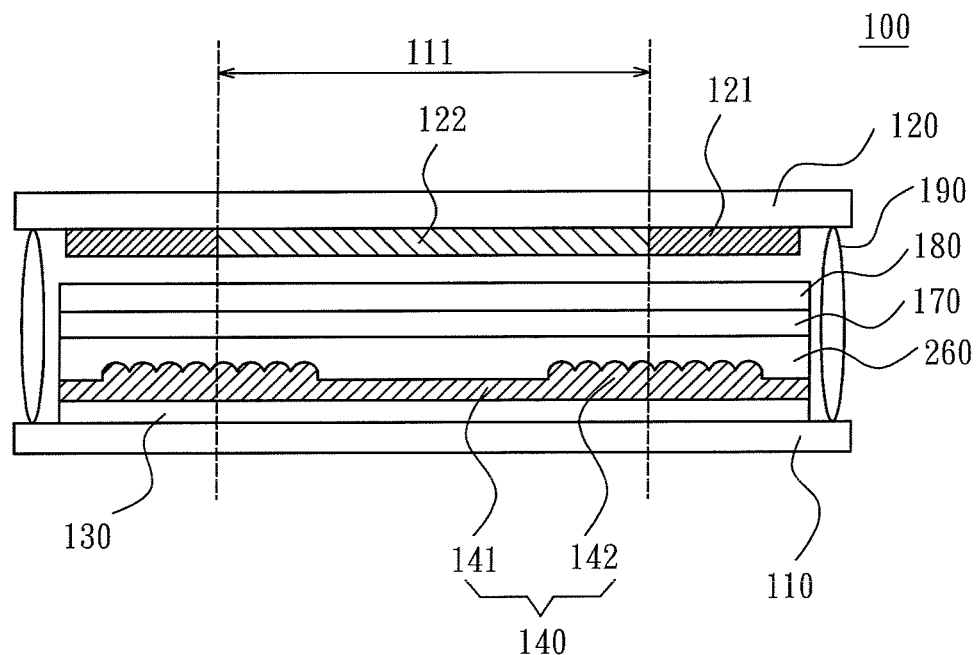
FIG. 4 is a partially cross-sectional view showing a display device according to a second embodiment of the present invention.

Please refer to FIG. 4, which is a partially cross-sectional view showing a display device according to a second embodiment of the present invention. In comparison with the first embodiment, the planar layer of the display device 100 of the second embodiment can be omitted. At this time, a first electrode 260 can be directly formed on the optical enhance layer 140. Furthermore, an uneven surface can be selectively formed on the surface of the display layer 170 which is formed on the uneven structures 142 by adjusting the thickness thereof. When the thickness of display layer 170 is thick enough to fill up the uneven structures 142, the whole surface of the display layer 170 is even. On the contrary, when the thickness of display layer 170 is thinner and not thick enough to fill up the uneven structures 142, the uneven structures can be correspondingly formed on the surface of the display layer 170, thereby increasing the emitting area thereof and raising the brightness.

Figure 5:
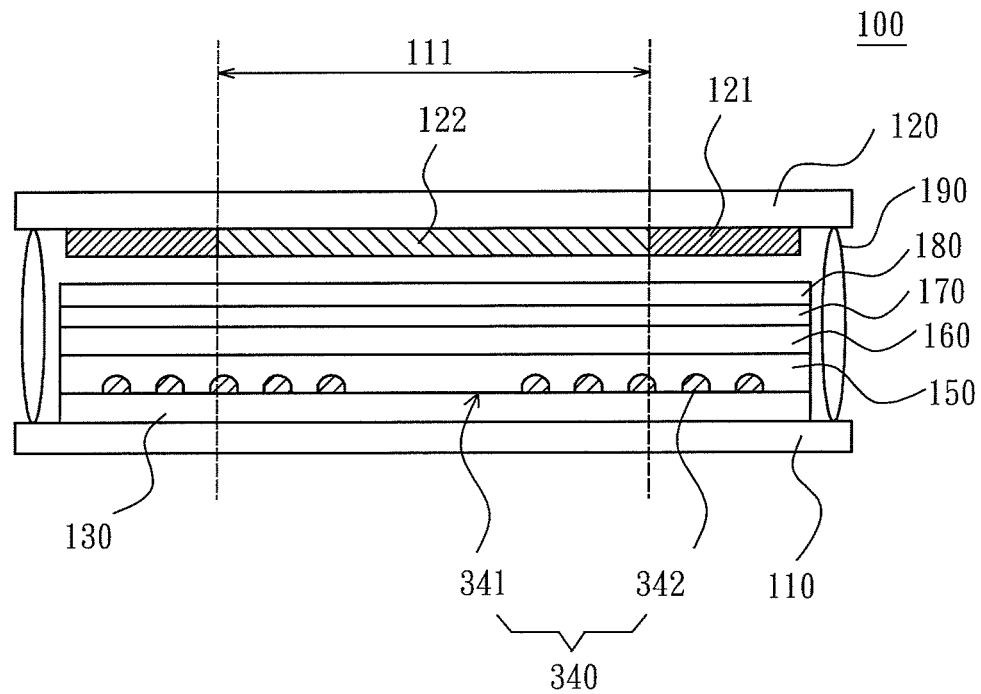
FIG. 5 is a partially cross-sectional view showing a display device according to a third embodiment of the present invention.

Please refer to FIG. 5, which is a partially cross-sectional view showing a display device according to a third embodiment of the present invention is presented herein. In comparison with the first embodiment, for each pixel area 111, the uneven structure 342 of the optical enhance layer 340 of the display device 100 of the third embodiment can be composed of independent and non-continuous micro-convexes formed on the reflective layer 130 and corresponding to a portion of the pixel area 111. An even surface 341 is formed between the micro-convexes. When forming the micro-convexes of the uneven structures 342, firstly, an insulating material layer can be formed on the reflective layer 130 or the first substrate 110, and the insulating material layer can be patterned by using a patterning method, such as photolithography or etching method to form the micro-convexes.

Figure 6:
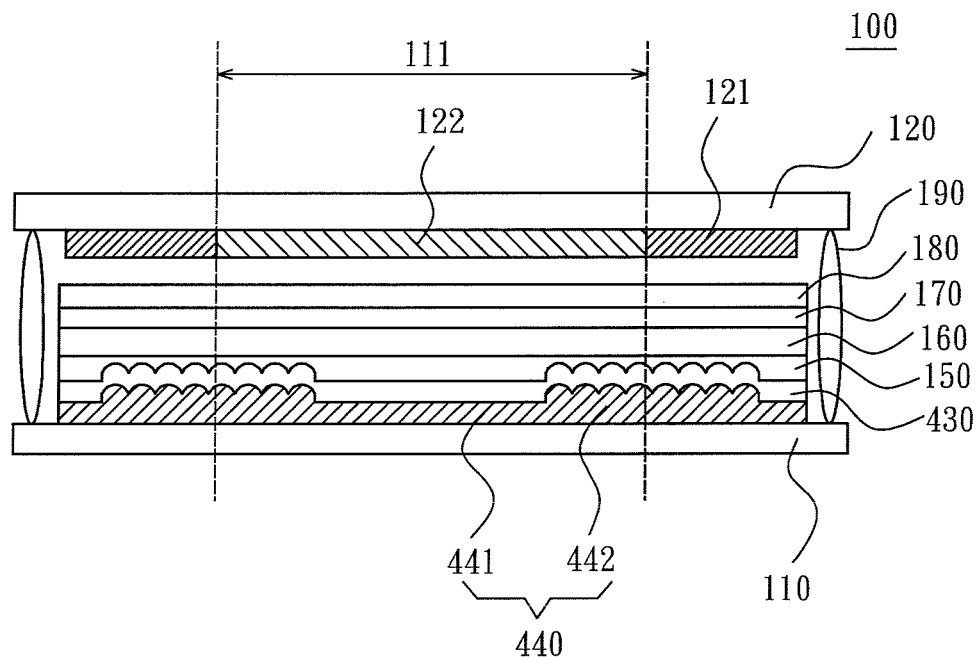
FIG. 6 is a partially cross-sectional view showing a display device according to a fourth embodiment of the present invention.

Please refer to FIG. 6, which is a partially cross-sectional view showing a display device according to a fourth embodiment of the present invention is presented herein. In comparison with the first embodiment, the optical enhance layer 440 of the display device 100 of the fourth embodiment can be directly formed on the first substrate 110, and the reflective layer 430 can be formed on the optical enhance layer 440. At this time, the reflective layer 430 positioned on the optical enhance layer 440 may have an uneven surface, thereby increasing the reflective area of the reflective layer 430 to raise the brightness thereof. Furthermore, for each pixel area 111, the uneven structure 442 is merely formed on the area corresponding to a portion of the pixel area 111 but not the whole pixel area 111. Therefore, the contrast of the display device 100 can be enhanced. At this time, the optical enhance layer 440 may be selectively not pervious to light, and the planar layer 150 of the display device 100 can be selectively disposed on the reflective layer 430 or not. When the planar layer 150 of the display device 100 is omitted, the reflective layer 430 and the first electrode 160 positioned on the uneven structures 442 may correspondingly have the uneven surface.

Figure 7A:
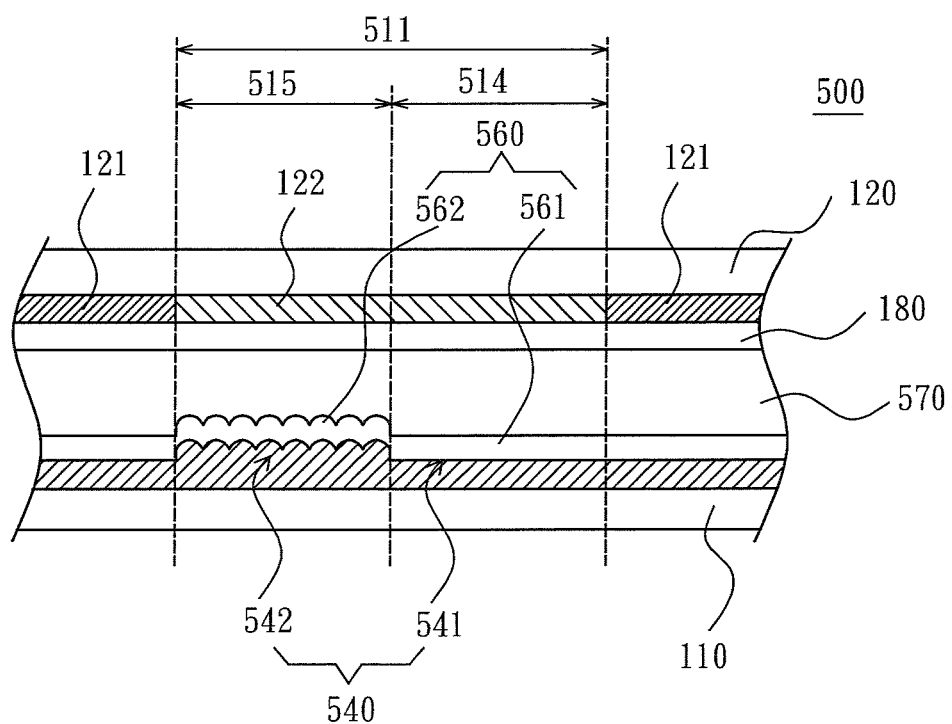
FIG. 7A and FIG. 7B are partially cross-sectional views showing a display device according to a fifth embodiment of the present invention.
Figure 7B:
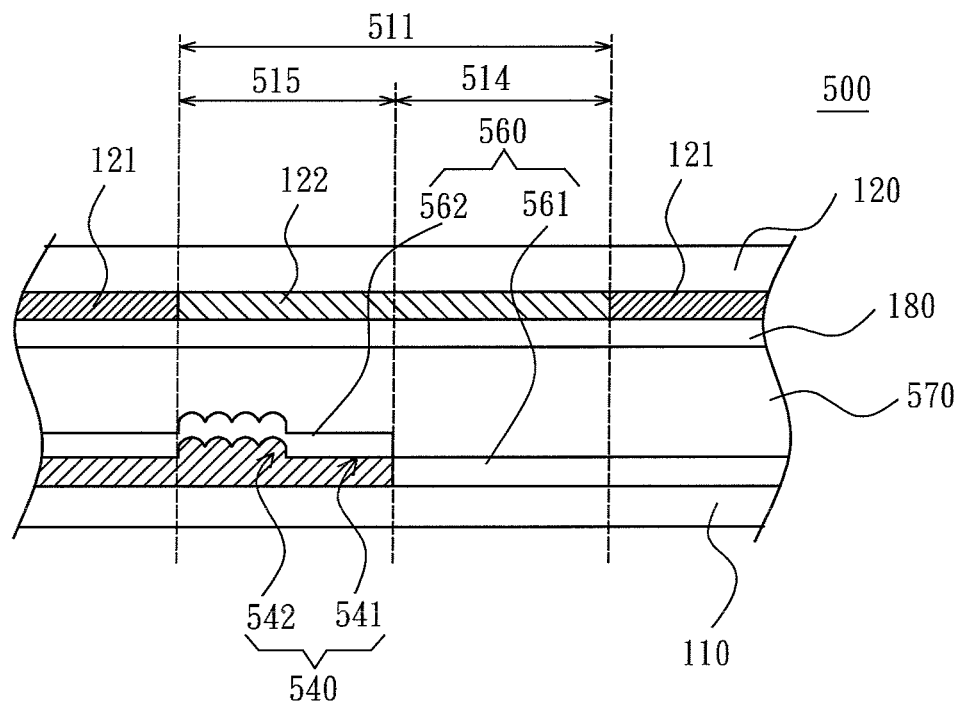

Please refer to FIG. 7A and FIG. 7B, which are partially cross-sectional views showing a display device according to a fifth embodiment of the present invention are presented herein. In comparison with the self-emission type display device of the first embodiment, the display device 500 may be a transflective LCD. At this time, the display device 500 may further comprise a backlight module for providing backlight. The display layer 570 may be a liquid crystal layer, and each of the pixel areas 511 may include a transmission area 514 and a reflection area 515. The planar layer may be omitted. The optical enhance layer 540 is formed on the first substrate 110. For each pixel area 511, the uneven structure 542 can correspond to the whole area (referring to FIG. 7A) or a partial area (referring to FIG. 7B) of the reflection area 515. Referring to FIG. 7B again, the even structure 541 of the optical enhance layer 540 may not correspond to the transmission area 514 but correspond to the reflection area 515. The first electrode 560 includes a transmission electrode 561 and a reflection electrode 562. The transmission electrode 561 is made of transparent and electrically-conductive material and formed on the transmission area 514. The reflection electrode 562 is made of reflective and electrically-conductive material, such as Al, Ag, Cr, Mo, Ti or AlNd, and formed on the reflection area 515. The second electrode 180 is disposed on the second substrate 120, wherein the second electrode 180 and the first electrode 560 can form an electric field for controlling the liquid crystal molecules of the liquid crystal layer to deflect. Since the reflection electrode 562 may be formed on the uneven structures 542, the reflection electrode 562 can also have an uneven surface corresponding thereto for increasing the reflective area thereof, thereby improving the optical effect and raising brightness and viewing angle.

Figure 8:
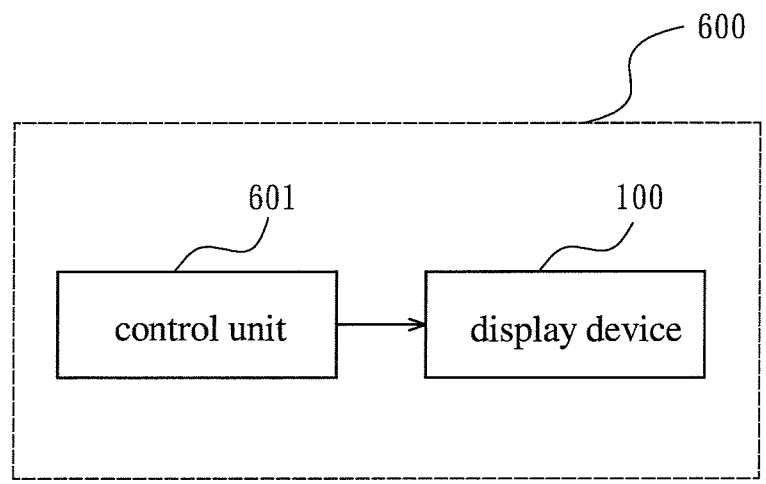
FIG. 8 is a block diagram showing an electrical apparatus comprising the display device according to the present invention.

Referring to FIG. 8, a block diagram showing an electrical apparatus comprising the display device according to the present invention are presented herein. The display device 100 or 500 of the present invention may be a portion of the electrical apparatus 600. The electrical apparatus 600 comprises the display device 100 and a control unit 601. The control unit 601 is electrically connected to the display device 100 to transmit signals thereto, thereby controlling the display device 100 to display images. The electrical apparatus 600 may be a mobile phone, a digital camera, a personal digital assistant, a desk-top computer, a portable computer, a television, a global positioning system, a mobile display, an aviation display, a portable DVD player or other electrical apparatus.

Therefore, the display device and the electrical apparatus of the present invention can include partial uneven structures to improve the optical effect, and the contrast thereof can be enhanced for enhancing the display quality.

As is understood by a person skilled in the art, the foregoing embodiments of the present invention are strengths of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A display device, comprising:
a first substrate including a plurality of pixel areas;
an optical enhance layer formed on the first substrate and including a plurality of even structures and a plurality of uneven structures;
a display layer formed on the optical enhance layer;
a first electrode formed between the optical enhance layer and the display layer, and completely overlapping the entire optical enhance layer within each pixel area; and
a second electrode formed on the display layer;
wherein for each pixel area, one of the even structures corresponds to a portion of the pixel area, and one of the uneven structures corresponds to another portion of the pixel area.

2. The display device as claimed in claim 1, wherein the first substrate further includes a plurality of switch devices disposed in the pixel areas and electrically connected to the first electrode.

3. The display device as claimed in claim 1, further comprising: a second substrate disposed on the second electrode.

4. The display device as claimed in claim 3, wherein the second substrate includes a plurality of black matrix layers and a plurality of color filter layers, and the color filter layers are separated by the black matrix layers.

5. The display device as claimed in claim 1, wherein a reflective layer is disposed between the optical enhance layer and the first substrate.

6. The display device as claimed in claim 1, wherein for each pixel area, the percentage of an area of the another portion of the pixel corresponding to the uneven structure is in a range from 10% to 90%.

7. The display device as claimed in claim 1, wherein each of the uneven structures comprises a plurality of continuous micro-convexes or micro-concaves, and each of the micro-convexes or the micro-concaves is in the form of a hemisphere shape, a cone, a pyramid shape or a rectangular block shape.

8. The display device as claimed in claim 1, wherein each of the uneven structures comprises a plurality of discrete micro-convexes.

9. The display device as claimed in claim 1, wherein for each pixel area, the uneven structure corresponds to an outer area of the pixel area, and the even structure corresponds to an inner area of the pixel area.

10. The display device as claimed in claim 1, wherein for each pixel area the uneven structure corresponds to an inner area of the pixel area, and the even structure corresponds to an outer area of the pixel area.

11. The display device as claimed in claim 1, wherein for each pixel area, the even structure and the uneven structure respectively has multiple regions arranged in an annular interlaced manner.

12. The display device as claimed in claim 1, wherein for each pixel area, the even structure and the uneven structure respectively has multiple regions arranged in a chessboard-like interlaced manner.

13. The display device as claimed in claim 1, further comprising: a planar layer formed between the optical enhance layer and the first electrode.

14. The display device as claimed in claim 1, wherein the first electrode and the second electrode are made of transparent and electrically-conductive material.

15. The display device as claimed in claim 1, wherein the display layer comprises an emission layer.

16. An electrical apparatus, comprising:
  a display device, comprising:
    a first substrate including a plurality of pixel areas;
    an optical enhance layer formed on the first substrate and including a plurality of even structures and a plurality of uneven structures, wherein for each pixel area, one of the even structures corresponds to a portion of the pixel area, and one of the uneven structures corresponds to the rest another portion of the pixel area;
    a display layer formed on the optical enhance layer;
    a first electrode formed between the optical enhance layer and the display layer, and completely overlapping the entire optical enhance layer within each pixel area; and
    a second electrode formed on the display layer; and
  a control unit electrically connected to the display device for transmitting signals thereto, wherein the electrical apparatus is a mobile phone, a digital camera, a personal digital assistant, a desk-top computer, a portable computer, a television, a global positioning system, a mobile display, an aviation display or a portable DVD player.

* * * * *